United States Patent [19]

Ukai et al.

[11] Patent Number: 5,614,729
[45] Date of Patent: Mar. 25, 1997

[54] TOP GATE THIN-FILM TRANSISTOR

[75] Inventors: Yasuhiro Ukai, Kobe; Tomihisa Sunata, Miki; Takanobu Nakagawa; Shu Takeuchi, both of Kobe, all of Japan

[73] Assignee: Hosiden Corporation, Osaka, Japan

[21] Appl. No.: 495,031

[22] Filed: Jun. 27, 1995

[30] Foreign Application Priority Data

Jul. 8, 1994 [JP] Japan .................................. 6-157013

[51] Int. Cl.$^6$ .................................................. H01L 29/04
[52] U.S. Cl. ........................... 257/57; 257/59; 257/61; 257/66; 257/70; 257/72
[58] Field of Search ........................... 257/57, 61, 66, 257/72, 59, 70

[56] References Cited

U.S. PATENT DOCUMENTS

| 5,275,851 | 1/1994 | Fonash et al. | 427/578 |
| 5,313,077 | 5/1994 | Yamazaki | 257/57 |

FOREIGN PATENT DOCUMENTS

| 2-27320 | 1/1990 | Japan | 257/57 |

Primary Examiner—Jerome Jackson, Jr.
Assistant Examiner—John Guay
Attorney, Agent, or Firm—Pollock, Vande Sande & Priddy

[57] ABSTRACT

A transparent insulation film is formed on a glass substrate. Source and drain electrodes are formed on the transparent insulation film with their ends in spaced and opposing relation. The entire face of the substrate is treated with $PH_3$ plasma to diffuse P atoms to form a doped surface layer. An a-Si semiconductor layer is formed on the doped surface layer so as to span a space between the source and drain electrodes with the opposite end portions of the semiconductor layer overlying those electrodes. A gate insulation film is formed on the semiconductor layer to extend all over the substrate. A gate electrode is formed of metal on the top of the gate insulation film 6 such that the opposite side edges of the gate electrode are recessed inwardly of the edges of the source and drain electrodes. An excimer laser beam is radiated against the face of the substrate with the gate electrode acting as a mask so that the laser-irradiated regions of the semiconductor layer comprise source and drain regions of n$^+$ poly-Si.

20 Claims, 7 Drawing Sheets

TOP GATE THIN-FILM TRANSISTOR

FIELD OF THE INVENTION

This invention relates to a top gate a-Si thin-film transistor and a method for producing the same and, more particularly, to such a method involving the self alignment performed by excimer laser-annealing and thin-film transistors produced by the method.

BACKGROUND OF THE INVENTION

A liquid crystal display panel by way of example, has pixel electrodes arrayed in the form of a matrix formed over the entire display surface area, the pixel electrodes being connected with the drain electrodes of respective thin-film transistors (as will be referred to as "TFT" hereinafter) formed adjacent to the pixel electrodes. The gate electrodes of the TFTs in each row of the matrix are connected to a corresponding gate bus while the source electrodes of the TFTs in each column are connected to a corresponding source bus. Upon a driving voltage being applied to a selected gate bus, the TFTs connected with the gate bus are turned on, so that the turned-on TFTs are supplied with respective image signals through the source buses whereby the corresponding pixel electrodes are loaded with electric charges according to the image signals.

Figure 1:
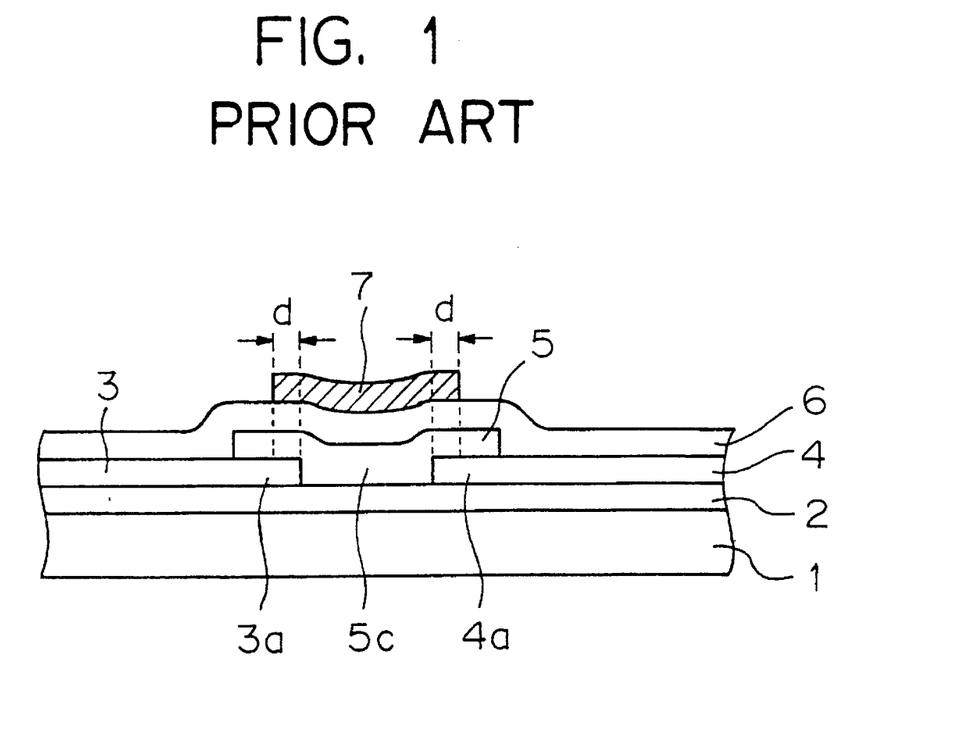
FIG. 1 is a cross-sectional view showing the structure of one example of the conventional top gate TFT.

FIG. 1 shows one example of the structure of each TFT such as a top gate TFT in such a matrix. As illustrated in FIG. 1, an insulation film 2 is formed on and all over one side surface of a glass substrate 1. Formed on the insulation film 2 are a source lead 3 and a drain lead 4 having at ends source electrode 3a and drain electrode 4a in opposed parallel relation. A semiconductor layer 5 of amorphous silicon (a-Si) overlies the insulation film 2 so as to extend between and overlap the opposed marginal edges of the source electrode 3a and the drain electrode 4a. The semiconductor layer 5 is covered by a gate insulation film 5 on which a gate electrode 7 is formed in confronting relation with the semiconductor layer 9.

With the TFT as shown in FIG. 1 it is preferred that the gate electrode 7 be formed such that the opposed side edges of the gate electrode 7 and the end edges of the source and drain electrodes 3a and 4a are in registration with each other because the ON-resistance of the TFT is increased if there is any portion of the semiconductor layer 5 in the channel region 50 between the source and drain electrodes 3a and 4a to which no gate voltage is applied. It is seen in the example of FIG. 1 that the formation is such that the opposed side edges of the gate electrode 7 will overlap the marginal edges of the source and drain electrodes 3a and 4a over the distance d. While this reduces the ON-resistance of the TFT, the response characteristics of the TFT are deteriorated due to parasitic capacitances produced between the gate electrode 7 and the source electrode 3a and between the gate electrode 7 and the drain electrode 4a.

One approach to overcoming these problems has been proposed by Sakoda, Matsumura et al as disclosed in the "IN-SITU CRYSTALLIZATION AND DOPING OF a-Si FILM BY MEANS OF SPIN-ON-GLASS" Mat. Res. Soc. Symp. Proc. Vol. 336. 1994. This approach will be described with reference to FIG. 2. A SOG (spin-on-glass) coating 9 doped with P atoms is applied as an insulation film onto a glass substrate and baked at 450° C., followed by forming on the coating 9 an a-Si semiconductor layer 5 which is in turn covered with a gate insulation film 6. Then, a gate electrode 7 is formed on the gate insulation film 6 prior to forming source and drain leads 3 and 4, respectively. An excimer laser beam 8 is radiated as indicated by arrows 8 with the gate electrode 7 as a mask to melt those hatched portions of the semiconductor layer 5 which are not shaded by the gate electrode 7 to thereby cause P atoms to diffuse from the SOG into the melted portions of the semiconductor layer 5. Upon termination of the laser radiation, the melted portions of the semiconductor layer are allowed to cool down to form an n-poly-Si having a high electrical conductivity.

Figure 2:
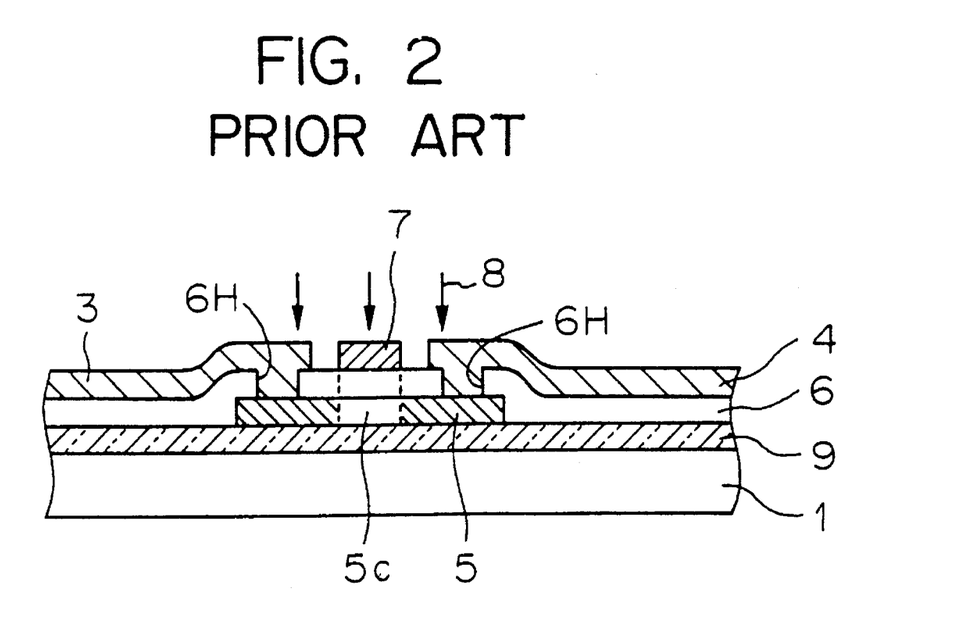
FIG. 2 is a cross-sectional view showing the structure of another example of the conventional top gate TFT.

Next, contact holes 6H are formed through the gate insulation film 6 on the opposite sides of the gate electrode 7 to reach the opposite marginal sides of the semiconductor layer 5, and then source and drain leads 3 and 4 are formed on the gate insulation film 6 such that one end of each of the source and drain leads 3 and 4 fills the corresponding contact hole 6H so as to contact the semiconductor layer 5. It is thus possible to reduce the parasitic capacitances and ON-resistances since the hatched $n^+$ poly-Si portions of the semiconductor layer serve as source and drain regions although the channel portion 5c of the layer remains a-Si.

However, there are difficulties in forming the SOG film uniformly and defectlessly over the entire large display surface area, because the SOG film 9 is inferior in film thickness distribution due to its being applied to the glass substrate by spin-coating and because the film is susceptible to cracks as it is subjected to baking especially when it is relatively thick. Such cracks can lead to pixel defects, breakage of source and gate buses, TFT defects, etc. Moreover, the baking of SOG at an elevated temperature of 400° C. or higher is likely to cause distortion and/or shrinkage of the glass substrate.

SUMMARY OF THE INVENTION

Accordingly, it is an object of this invention to provide a TFT having reduced parasitic capacitance and ON-resistance and a method of making the same without employing SOG having the problems described above.

The top gate thin-film transistor according to a first aspect of this invention may be produced by a method according to the invention comprising the following steps:

(a) forming source and drain electrodes on a glass substrate with end edges of those electrodes in spaced and opposed relation;

(b) subjecting the entire face of the substrate on which the source and drain electrodes are formed to plasma treatment to form a doped surface layer having impurity atoms diffused therein;

(c) forming an a-Si semiconductor layer on the doped surface layer so as to span a space between the source and drain electrodes with the opposite end portions of the semiconductor layer straddling those electrodes;

(d) forming a gate insulation film on the semiconductor layer to extend all over the face of the substrate;

(e) forming a gate electrode of metal on the top of the gate insulation film in opposed relation with the a-Si semiconductor layer between the source and drain electrodes such that the opposite side edges of the gate electrode are recessed by a predetermined distance inwardly of the source and drain electrodes; and (f) radiating a laser beam perpendicularly against the face of the substrate with the gate electrode acting as a mask to convert the portions of the semiconductor layer irradiated with the laser beam to poly-Si layer portions having the aforesaid impurities diffused therein to define source and drain regions while allowing the portion of the semiconductor layer masked by the gate electrode to remain as a channel region of a-Si.

The top gate thin-film transistor according to a second aspect of this invention may be produced by a method according to the invention comprising the following steps:
(a) forming a light shield having a predetermined width on a glass substrate;
(b) forming a transparent insulation film on the the light shield to extend all over the face of the glass substrate;
(c) forming a source electrode and a drain electrode on the transparent insulation film such that one end edges of the electrodes are in opposed relation with and spaced by a predetermined distance outwardly of the corresponding opposite side edges of the light shield;
(d) subjecting the entire face of the substrate to plasma treatment from the top of the source and drain electrodes to form a doped surface layer having impurity atoms diffused therein;
(e) forming an a-Si semiconductor layer on the doped surface layer so as to span a space between the source and drain electrodes with the opposite end portions of the semiconductor layer straddling those electrodes;
(f) forming a gate insulation film on the semiconductor layer to extend all over the face of the substrate;
(g) exposing the substrate to light from the back surface thereof with the light shield acting as a mask to form a gate electrode composed of transparent conductive film by photolithography on that portion of the gate insulation film which is shaded by the light shield; and
(h) radiating a laser beam perpendicularly against the back surface of the substrate with the light shield acting as a mask to convert the portions of the semiconductor layer irradiated with the laser beam to poly-Si layer portions having the aforesaid impurities diffused therein to define source and drain regions while allowing the portion of the semiconductor layer masked by the gate electrode to remain as a channel region of a-Si.

The top gate thin-film transistor according to a third aspect of this invention may be produced by a method according to the invention comprising the following steps:
(a) subjecting the entire face of a substrate to plasma treatment to form a doped surface layer having impurity atoms diffused therein;
(b) forming a generally rectangular semiconductor of a-Si on the doped surface layer;
(c) forming a gate insulation film on the semiconductor layer to extend all over the face of the substrate;
(d) forming a gate electrode of metal on the top of the gate insulation film such that the opposite side edges of the gate electrode are recessed by a predetermined distance inwardly of the corresponding opposite end edges of the semiconductor layer;
(e) radiating a laser beam perpendicularly against the face of the substrate with the gate electrode acting as a mask to convert the portions of the semiconductor layer irradiated with the laser beam to poly-Si layer portions having the aforesaid impurities diffused therein to define source and drain regions while allowing the portion of the semiconductor layer masked by the gate electrode to remain as a channel region of a-Si;
(f) forming contact holes through the gate insulation film adjacent the opposite side edges of the gate electrode to extend to the source region and the drain region, respectively; and
(g) forming a source electrode and a drain electrode to extend over the gate insulation film such that one ends of the source and drain electrodes fill the corresponding contact holes so as to contact the source region and drain region, respectively.

The top gate thin-film transistor according to a fourth aspect of this invention may be produced by a method according to the invention comprising the following steps:
(a) forming a light shield having a predetermined width on a glass substrate;
(b) forming a transparent insulation film on the light shield to extend all over the face of the glass substrate;
(c) subjecting the entire face of the substrate to plasma treatment from the top of the transparent insulation film to form a doped surface layer having impurity atoms diffused therein;
(d) forming a generally rectangular semiconductor layer of a-Si on the doped surface layer in opposed relation with the light shield such that the opposite ends of the semiconductor layer extend outwardly of the corresponding opposite side edges of the light shield;
(e) forming a gate insulation film on the semiconductor layer to extend all over the face of the substrate;
(f) exposing the substrate to light from the back surface thereof with the light shield acting as a mask to form a gate electrode composed of transparent conductive film by photolithography on that portion of the gate insulation film which is shaded by the light shield;
(g) radiating a laser beam perpendicularly against the back surface of the substrate with the light shield acting as a mask to convert the portions of the semiconductor layer irradiated with the laser beam to poly-Si layer portions having the aforesaid impurities diffused therein to define source and drain regions while allowing the portion of the semiconductor layer masked by the gate electrode to remain as a channel region of a-Si;
(h) forming contact holes through the gate insulation film adjacent the opposite side edges of the gate electrode to extend to the source region and the drain region, respectively; and
(i) forming a source electrode and a drain electrode to extend over the gate insulation film such that one ends of the source and drain electrodes fill the corresponding contact holes so as to contact the source region and drain region, respectively.

In the first to fourth aspects of this invention, the plasma treatment may be plasma treatment with $PH_3$; the impurity atoms may comprise P atoms; and the source and drain regions may comprise $n^+$ type poly-Si layers.

In the first to fourth aspects of this invention, the plasma treatment may be plasma treatment with $B_2H_6$; the impurity atoms may comprise B atoms; and the source and drain regions may comprise $p^+$ type poly-Si layers.

In the first to fourth aspects of this invention, the laser beam may be an excimer laser beam.

DETAILED DESCRIPTION OF THE PREFERRED EMBODIMENTS

First Embodiment

Figures 5E, 5F, 5G:
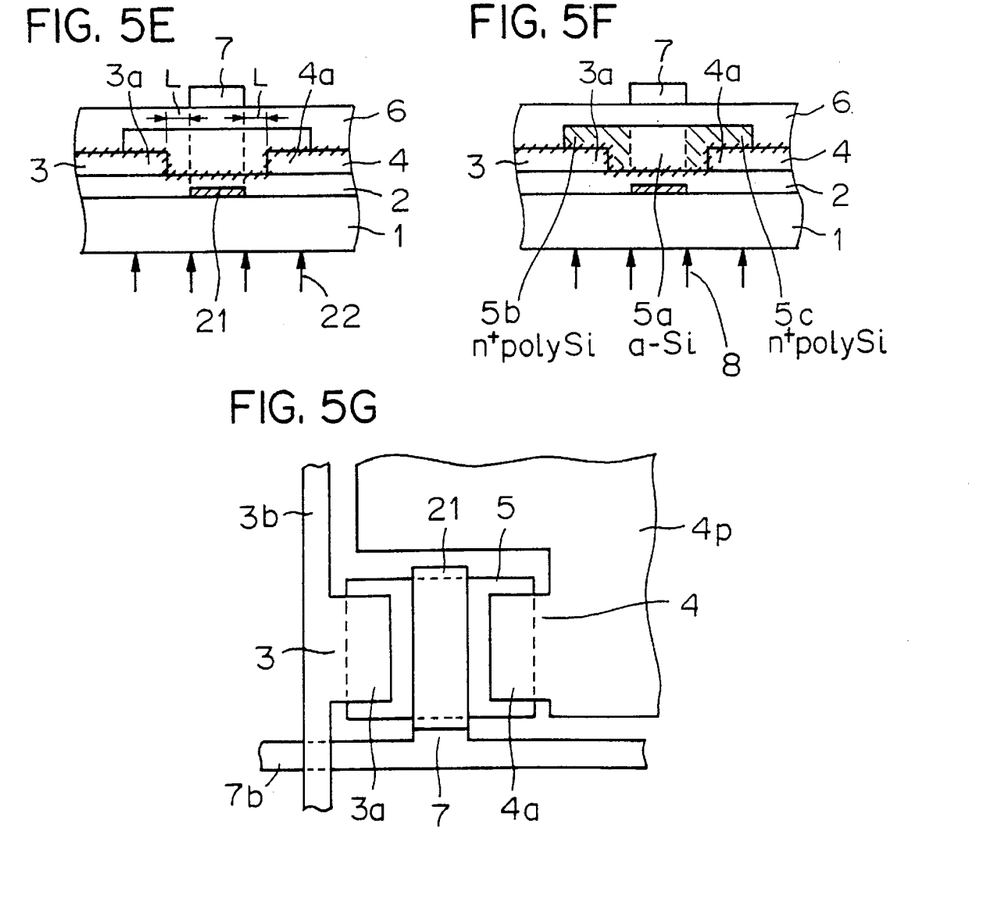
FIG. 5E is a diagrammatical, cross-sectional representation of the fifth step of the third method of this invention.
FIG. 5F is a diagrammatical, cross-sectional representation of the sixth step of the third method of this invention.
FIG. 5G is a bottom plan view of the TFT produced by the third method of this invention.
Figure 6A:
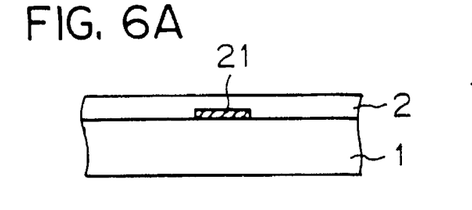
FIG. 6A is a diagrammatical, cross-sectional representation of the first step of the fourth method of this invention.
Figure 6B:
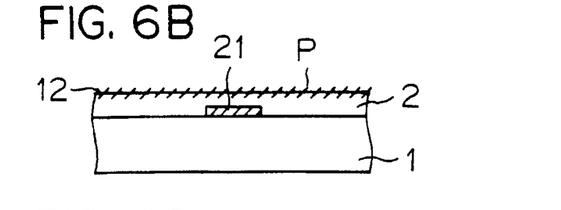
FIG. 6B is a diagrammatical, cross-sectional representation of the second step of the fourth method of this invention.
Figure 6C:
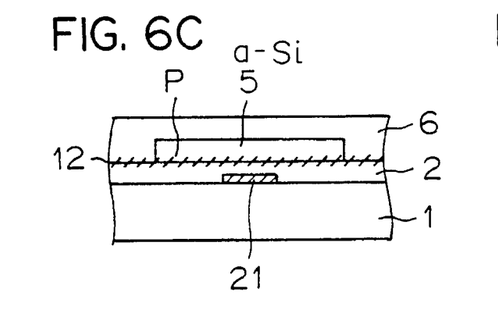
FIG. 6C is a diagrammatical, cross-sectional representation of the third step of the fourth method of this invention.
Figure 6D:
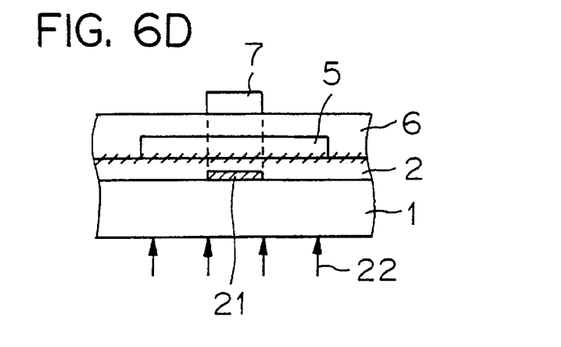
FIG. 6D is a diagrammatical, cross-sectional representation of the fourth step of the fourth method of this invention.
Figure 6E:
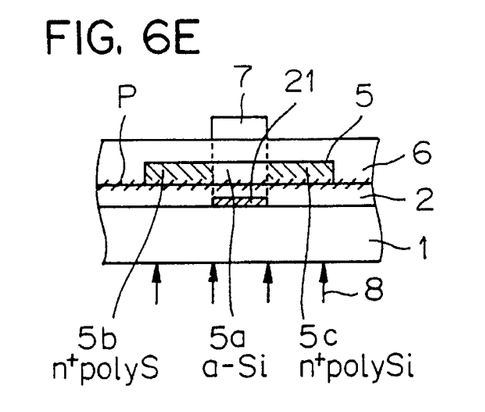
FIG. 6E is a diagrammatical, cross-sectional representation of the fifth step of the fourth method of this invention.
Figure 6F:
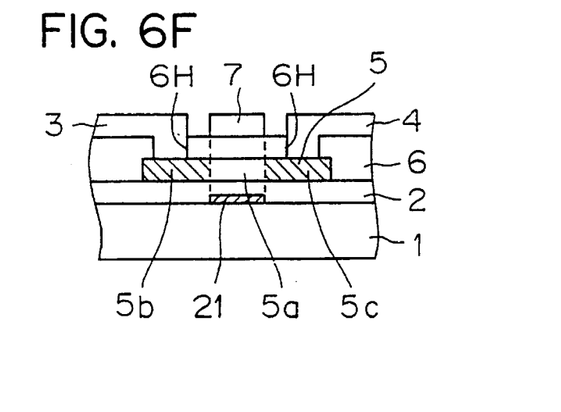
FIG. 6F is a diagrammatical, cross-sectional representation of the sixth step of the fourth method of this invention.
Figure 6G:
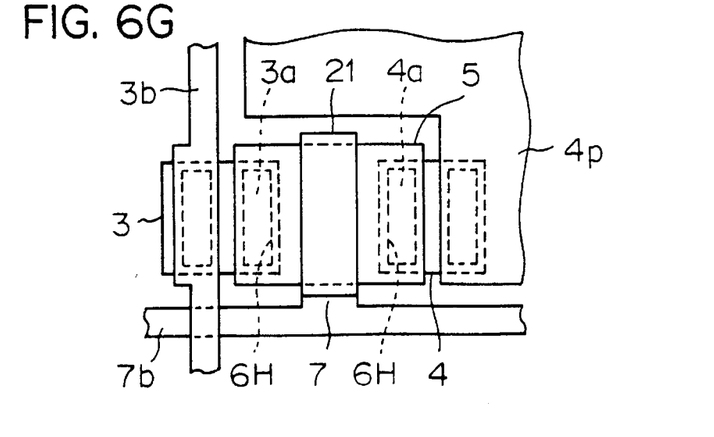
FIG. 6G is a bottom plan view of the TFT produced by the fourth method of this invention.

The first embodiment of this invention will now be described by reference to the sequence of process steps shown in FIGS. 3A–3F. The TFT produced thereby is shown in a plan view in FIG. 3G illustrating one of the TFTs comprising a liquid crystal display panel being connected to a source bus 3b, a pixel electrode 4p and a gate bus 7b. This is also the case with FIGS. 4G, 5G and 6G showing the other embodiments which will be described hereinbelow.

Figure 3A:
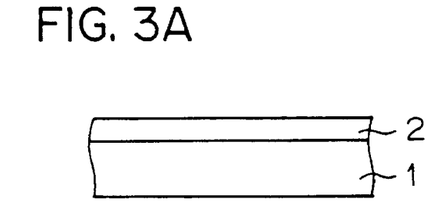
FIG. 3A is a diagrammatical, cross-sectional representation of the first step of the first method of this invention.

(a) First, a transparent insulation film 2 such as $SiO_2$ or $SiN_x$ is formed on and all over one side surface of a glass substrate 1 as illustrated in FIG. 3A.

Figure 3B:
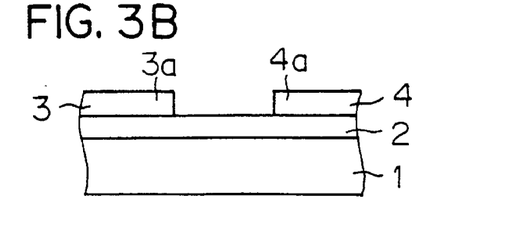
FIG. 3B is a diagrammatical, cross-sectional representation of the second step of the first method of this invention.
Figure 3C:
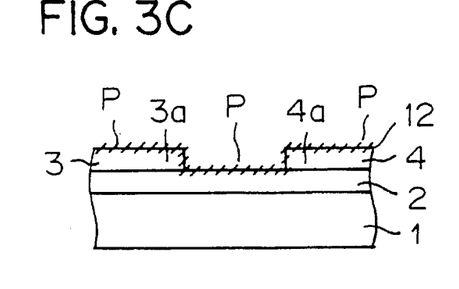
FIG. 3C is a diagrammatical, cross-sectional representation of the third step of the first method of this invention.
Figure 3D:
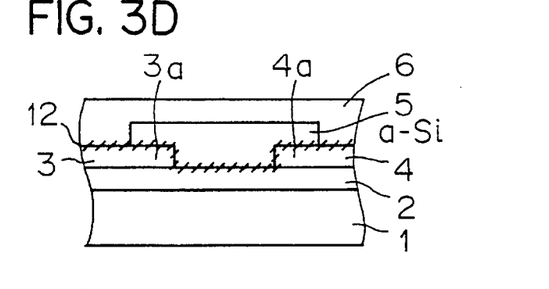
FIG. 3D is a diagrammatical, cross-sectional representation of the fourth step of the first method of this invention.
Figure 3E:
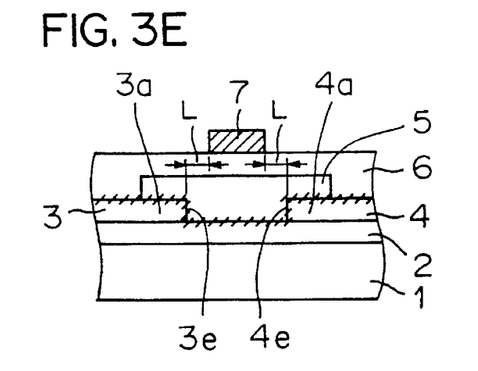
FIG. 3E is a diagrammatical, cross-sectional representation of the fifth step of the first method of this invention.
Figure 3F:
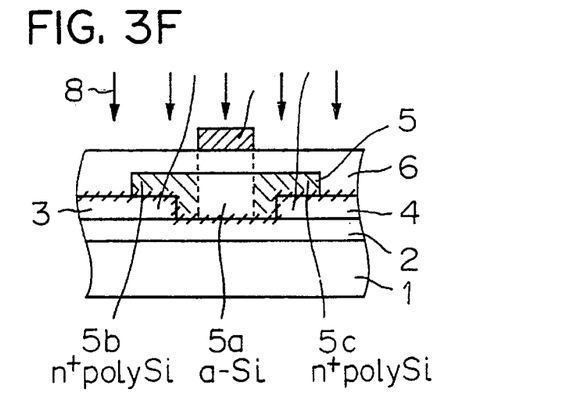
FIG. 3F is a diagrammatical, cross-sectional representation of the sixth step of the first method of this invention.
Figure 3G:
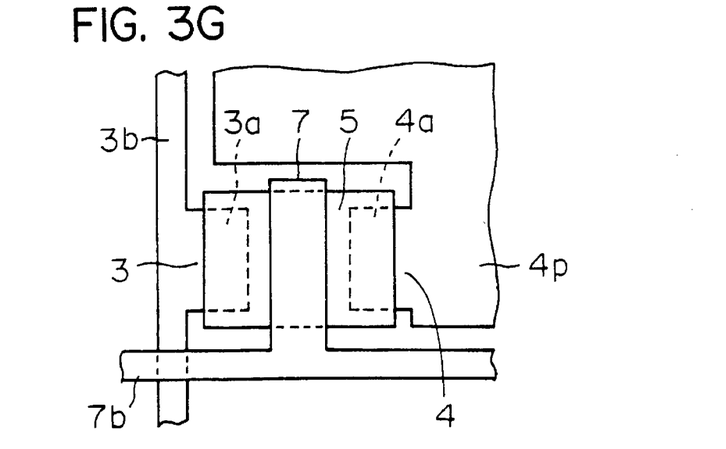
FIG. 3G is a plan view of the TFT produced by the first method of this invention.

(b) Source and drain leads 3 and 4, respectively are formed of ITO (indium.tin oxide), Mo or Mo alloy on the transparent insulation film 2 (see FIGS. 3B and 3G). The ends of the source and drain leads 3 and 4 comprise source and drain electrodes 3a and 4a, respectively, the edges 3e and 3e of which are spaced apart from and parallel to each other.

(c) The entire face of the substrate is treated with $PH_3$ plasma to diffuse P atoms into the surface to form a doped surface layer 12 (see FIG. 3C).

(d) A generally rectangular a-Si semiconductor layer 5 is formed on the doped surface layer 12 so as to cover that portion of the transparent insulation film 2 lying between the source and drain electrodes 3a and 4a with the opposite end portions of the semiconductor layer 5 straddling those electrodes, followed by forming a gate insulation film 6 such as $SiN_x$ or $SiO_2$ all over the face of the substrate (see FIG. 3D). The $n^+$ a-Si semiconductor layer 5 may be produced in an atmosphere of silane gas ($SiH_4$) having phosphine gas ($PH_3$) incorporated therein by plasma CVD process whereby highly conductive amorphous silicon which is doped with impurity atoms P and excessively enriched in electrons may be obtained.

(e) A gate electrode 7 is then formed of Al or Al alloy on the top of the gate insulation film 6 (see FIG. 3E). The gate electrode 7 is formed such that it opposes the portion of the a-Si semiconductor layer 5 between the electrodes 3a and 4a with the gate insulation film 6 interposed therebetween and the opposite side edges of the gate electrode are recessed by a distance L inwardly of the edges 3e and 4e of the electrodes 3a and 4a. The distance L is determined by taking into account possible pattern alignment errors of the gate electrode 7 so that the gate electrode would not overlap either of the source and drain electrodes 3a and 4a.

(f) An excimer laser beam 8 is radiated normally against the face of the substrate with the gate electrode 7 acting as a mask for a short period of time. The a-Si semiconductor layer 5 is melted in the regions irradiated with the laser beam to take in P atoms as impurities from underlying boundary with electrodes 3a, 4a and the transparent insulation film 2. Upon termination of the laser radiation, the Si is allowed to cool down to be polycrystalized to thereby form source and drain regions 5b and 5c, respectively of $n^+$ poly-Si having a high conductivity. The portion of the semiconductor layer within the region shaded by the gate electrode 7 remains a-Si and serves as a channel region 5a (see FIG. 3F).

It is to be noted that the reason for choosing an excimer laser beam among various types of laser beams is that the excimer laser will not provide such deleterious effects as reducing the electric conductivity of the ITO that forms a pixel electrode, not shown, to which the drain lead 4 of the TFT as well as the conductivity of the source and drain leads 3, 4 when they are made of ITO.

As indicated above, in this embodiment where an excimer laser beam is radiated with the gate electrode 7 acting as a mask to form the channel region 5a, source region 5b, and drain region 5c, there is no area where the gate electrode 7 and the source and drain regions 5b, 5c overlap each other as is the case with the prior art arrangement shown in FIG. 2, so that the parasitic capacitances are significantly reduced. In addition, the ON-resistance between the source electrode 3a and the drain electrode 4a is also reduced since the portion of the semiconductor layer not opposing the gate electrode 7 is converted to $n^+$ poly-Si having a high conductivity.

Moreover, it is possible to form a TFT without the need for heating the glass substrate 1 to such an elevated temperature as required in the SOG process; for in this embodiment P atoms are caused by the use of plasma treatment rather than SOG to diffuse into and across the exposed surfaces of the electrodes 3a, 4a and of the portion of the insulation film 2 between the electrodes so that P atoms may be caused to diffuse into and across the a-Si semiconductor layer 5 subsequently formed on those exposed surfaces by laser irradiation of the layer 5 with the gate electrode 7 as a mask. Further, the cracking problem incidental to the use of BOG may be eliminated.

Second Embodiment

The second embodiment of this invention will be described with reference to FIGS. 4A–4F. The TFT produced thereby is shown in FIG. 4G. This embodiment is different from that of FIGS. 3A–3G in that the source and drain leads 3 and 4 are formed on the same gate insulation film 5 as that on which the gate electrode 7 is formed as in FIG. 2 and are connected with the source 5b and drain 5c through contact holes 6H.

Figure 4A:
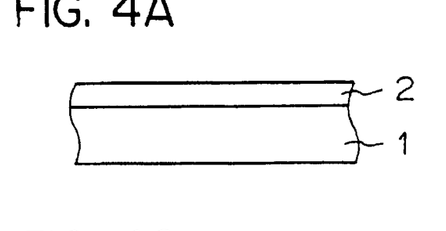
FIG. 4A is a diagrammatical, cross-sectional representation of the first step of the second method of this invention.

(a) A transparent insulation film 2 such as $SiO_2$ or $SiN_x$ is formed on and all over one side surface of a glass substrate (see FIG. 4A).

Figure 4B:
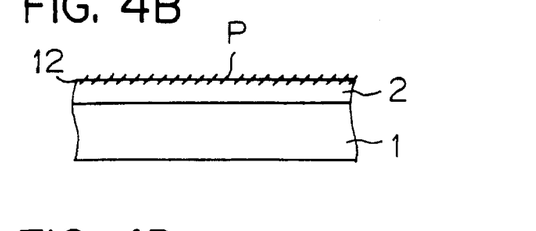
FIG. 4B is a diagrammatical, cross-sectional representation of the second step of the second method of this invention.

(b) The surface of the transparent insulation film 2 is treated with $PT_3$ plasma to form a doped surface layer 12 having P atoms diffused therein (see FIG. 4B).

Figure 4C:
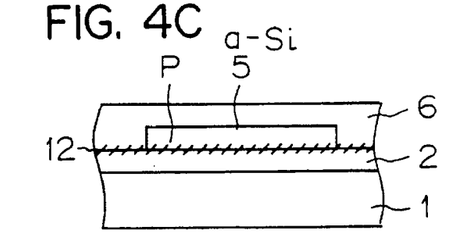
FIG. 4C is a diagrammatical, cross-sectional representation of the third step of the second method of this invention.

(c) A generally rectangular a-Si semiconductor layer 5 is formed on the doped surface layer 12, and on the top of which a gate insulation film 6 such as $SiN_x$ or $SiO_2$ is formed to extend all over the face of the substrate (see FIG. 4C).

Figure 4D:
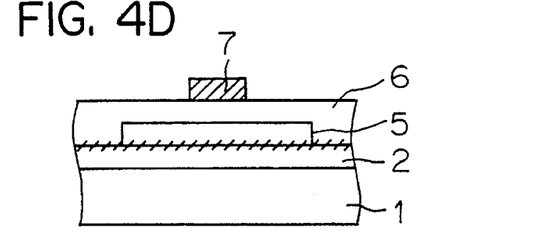
FIG. 4D is a diagrammatical, cross-sectional representation of the fourth step of the second method of this invention.
Figure 4E:
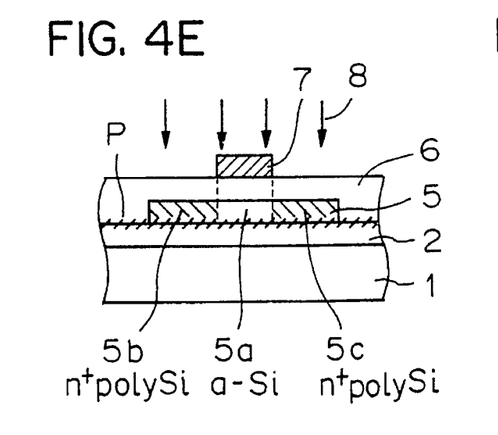
FIG. 4E is a diagrammatical, cross-sectional representation of the fifth step of the second method of this invention.
Figure 4F:
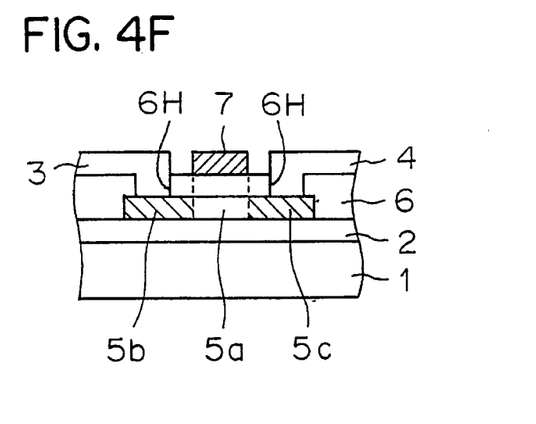
FIG. 4F is a diagrammatical, cross-sectional representation of the sixth step of the second method of this invention.
Figure 4G:
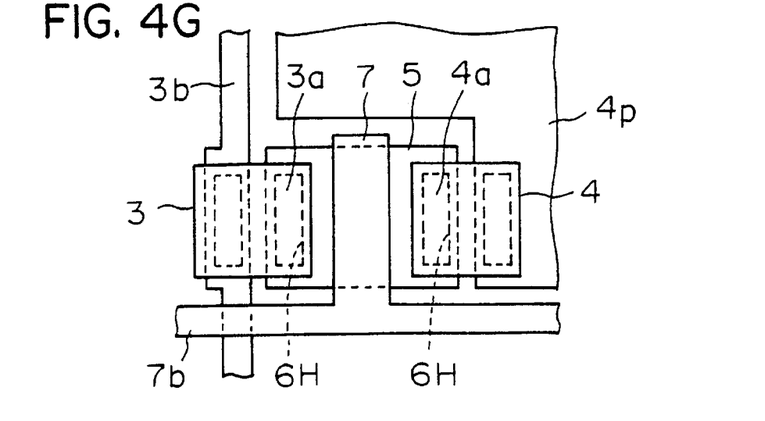
FIG. 4G is a plan view of the TFT produced by the second method of this invention.

(d) A gate electrode 7 is formed of Al, Al alloy or the like on the top of the gate insulation film 5 (see FIG. 4D and 4G). The opposite side edges of the gate electrode 7 are recessed by substantially equal distances inwardly of the corresponding opposite edges of the semiconductor layer 5.

(e) An excimer laser beam 8 is briefly radiated normally against the face of the substrate with the gate electrode 7 acting as a mask to thereby convert the laser irradiated portions of the semiconductor layer 5 into source and drain regions 5b and 5c, respectively composed of $n^+$ poly-Si (see FIG. 4E). The portion of the semiconductor layer shaded by the gate electrode 7 remains a-Si and serves as a channel region 5a.

(f) Contact holes 6H, 6H are formed through the gate insulation film 6 adjacent the gate electrode 7 to reach the source region 5b and drain region 5c, respectively. Then, source and drain leads 3 and 4 are formed on the gate insulation film 6 as by sputtering of metal such that one ends of the source and drain leads fill the corresponding contact holes 6H so as to contact the source region 5b and drain region 5c, respectively (see FIG. 4F).

Third Embodiment

In the embodiment of FIGS. 3A–3G as described above, when the gate electrode 7 is made of transparent conductive film such as ITO, the gate electrode cannot be used as a mask during the laser annealing for partial polycrystalization of the a-Si semiconductor layer 5. In that case, the present invention may be practiced by utilizing for the self-alignment process a light shield used to reduce the influences exerted by the photoconductive effects on the Si semiconductor layer 5. Such an embodiment of the invention is illustrated in FIGS. 5A–5F, and the TFT produced thereby is shown in a bottom plan view in FIG. 5G.

Figure 5A:
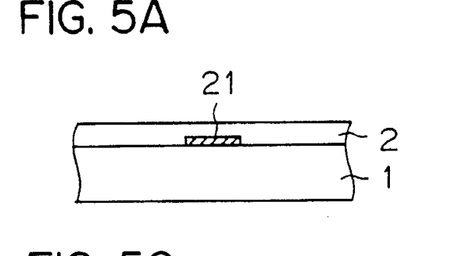
FIG. 5A is a diagrammatical, cross-sectional representation of the first step of the third method of this invention.

As illustrated in FIG. 5A, a rectangular light shield 21 is formed of a metal layer on a glass substrate 1 before a transparent insulation film 2 is formed on and all over one side surface of the glass substrate 1 so as to cover the light shield.

Figure 5B:
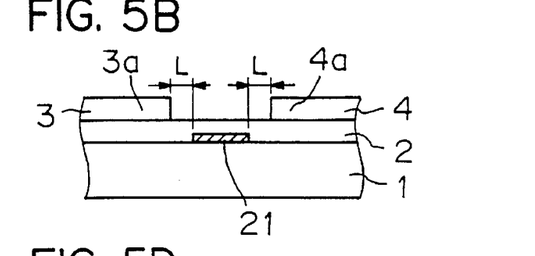
FIG. 5B is a diagrammatical, cross-sectional representation of the second step of the third method of this invention.
Figure 5C:
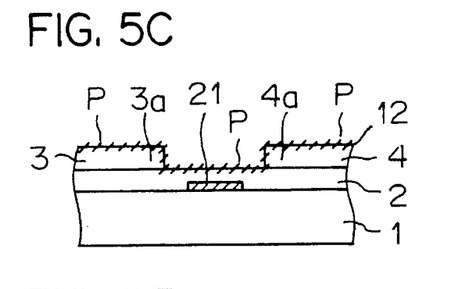
FIG. 5C is a diagrammatical, cross-sectional representation of the third step of the third method of this invention.
Figure 5D:
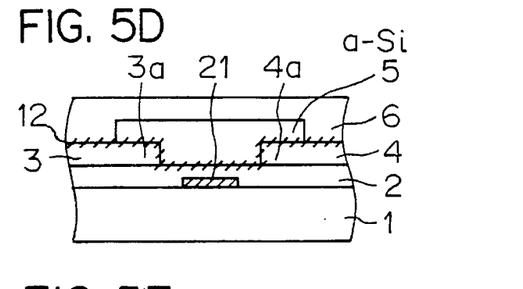
FIG. 5D is a diagrammatical, cross-sectional representation of the fourth step of the third method of this invention.

In the subsequent steps illustrated in FIGS. 5B–5D, as in the steps of FIGS. 3B–3D, source and drain leads 3 and 4, respectively are formed with one ends of the leads comprising source and drain electrodes 3a and 4a which are spaced apart from each other. The distances L between the opposite side edges of the light shield 21 and the corresponding edges of the electrodes 3a and 4a may be equal to the distances L between the opposite side edges of the gate electrode 7 and the corresponding edges of the electrodes 3a and 4a as in FIG. 3E. The assembly is treated with $PH_3$ plasma all over the surface thereof to diffuse P atoms into the surface layer to form a doped surface layer 12 (FIG. 5C), and a-Si semiconductor layer 5 is formed on the doped surface layer 12 so as to span between the source and drain electrodes 3a and 4a, followed by forming a gate insulation film 6 (FIG. 5D).

Then, as shown in FIG. 5E, a gate electrode 7 composed of transparent conductive film such as ITO is formed on that portion of the gate insulation film 6 which is shaded by the light shield 21 by photolithography using exposure to back light 22 with the light shield 21 acting as a mask. In this way, the gate electrode 7 may be accurately patterned on the location overlying the light shield 21.

Further, as shown in FIG. 5F, the annealing of the a-Si semiconductor layer 5 (diffusion of impurities P atoms into the Si layer and the subsequent polycrystalization thereof) may be carried out by radiation of a laser beam from the back surface of the substrate with the light shield 21 acting as a mask. The self-alignment may thus be effected with about the same precision as in the case of FIG. 3A–3F utilizing the gate electrode as a mask.

Fourth Embodiment

In the embodiment of FIGS. 4A–4G as described above, when the gate electrode 7 is made of ITO, it is possible, as in the case of FIGS. 5A–5F, to form a light shield 21 which may be used as a mask to define the gate electrode 7 by patterning and which may also be used as a mask to effect laser-annealing of the a-Si semiconductor layer 5. The steps of the TFT manufacturing process according to such alternative embodiment are illustrated in FIGS. 6A–6F, and the TFT produced thereby is shown in a bottom plan view in FIG. 6G. These steps will be apparent from the foregoing descriptions of the embodiments of FIGS. 4A–4G and of FIGS. 5A–5F. Accordingly, further description is omitted for purposes of convenience.

The present invention as described above with respect to the various illustrated embodiments is based on the fact that the n⁺ poly-Si which may be produced by causing P atoms to diffuse from the plasma-treated underlying surface layer 12 into the a-Si layer through laser-annealing and cooling the a-Si layer will provide a higher electric conductivity than the a-Si. This has been confirmed by experiments to be described below.

Figure 7:
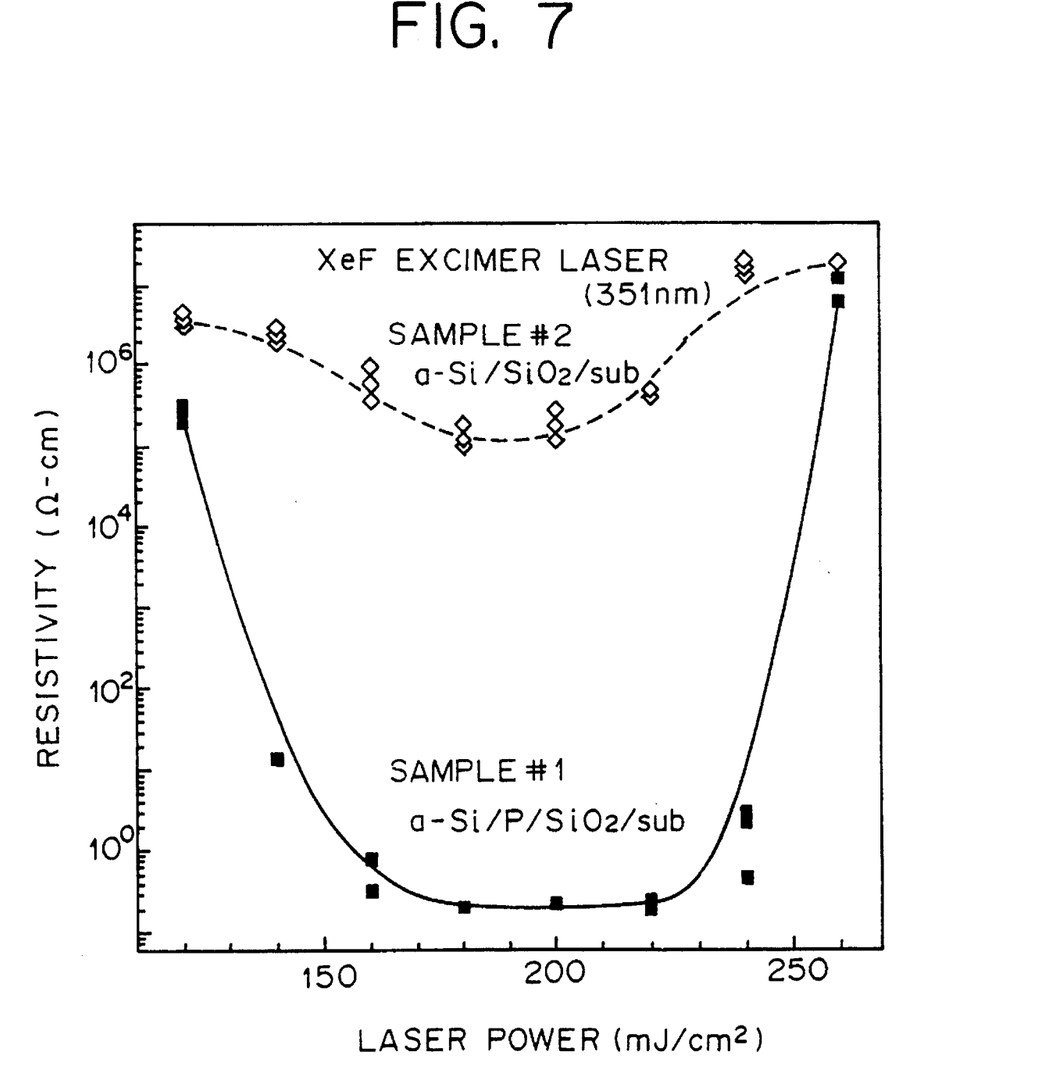
FIG. 7 is a graph showing the measured results of the resistivity versus irradiation energy of XeF excimer laser annealing for the samples #1 and #2 in which $SiO_2$ film was P-treated for the former and not P-treated for the latter prior to forming an a-Si layer thereon.

FIG. 7 shows the measured results of the resistivity versus the input energy of laser radiated for XeF excimer laser-annealing for two samples #1 and #2 of TFT. The sample #1 was prepared by forming a transparent insulation film (SiO₂) on a glass substrate 1 and subjecting the surface layer of the insulation film to P-treatment (PH₃ plasma treatment to diffuse P atoms into the exposed surface) prior to forming an a-Si layer on the insulation film. The sample #2 of TFT was similarly prepared, but not subjected to P-treatment prior to forming an a-Si layer.

Figure 8A:
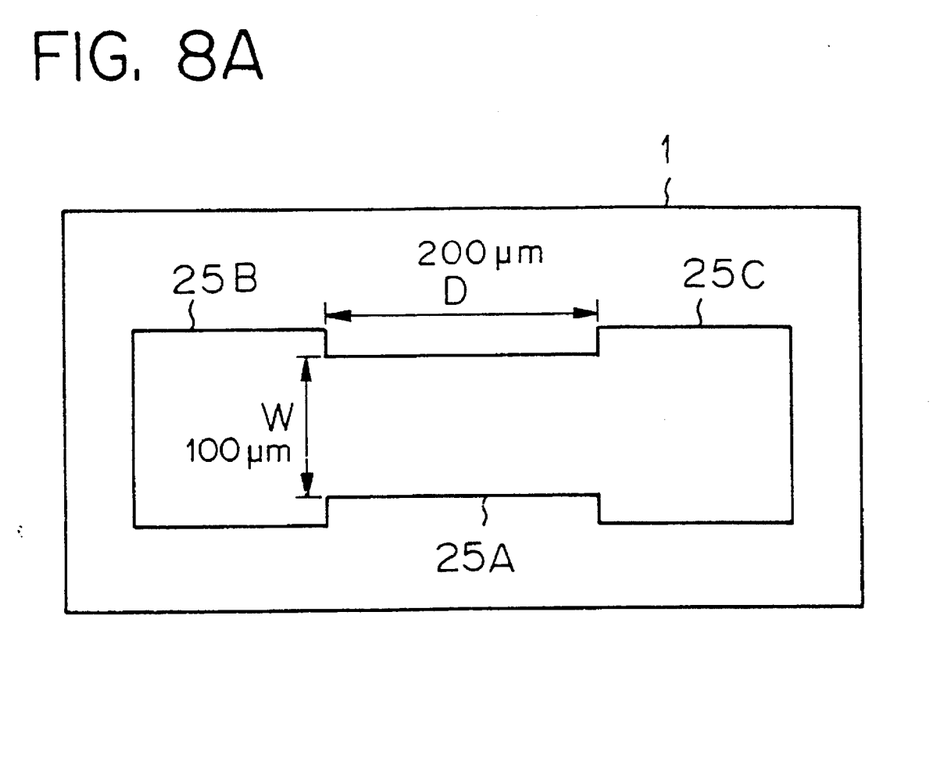
FIG. 8A is a plan view showing the pattern of the a-Si layer of the samples #1 and 2.
Figure 8B:
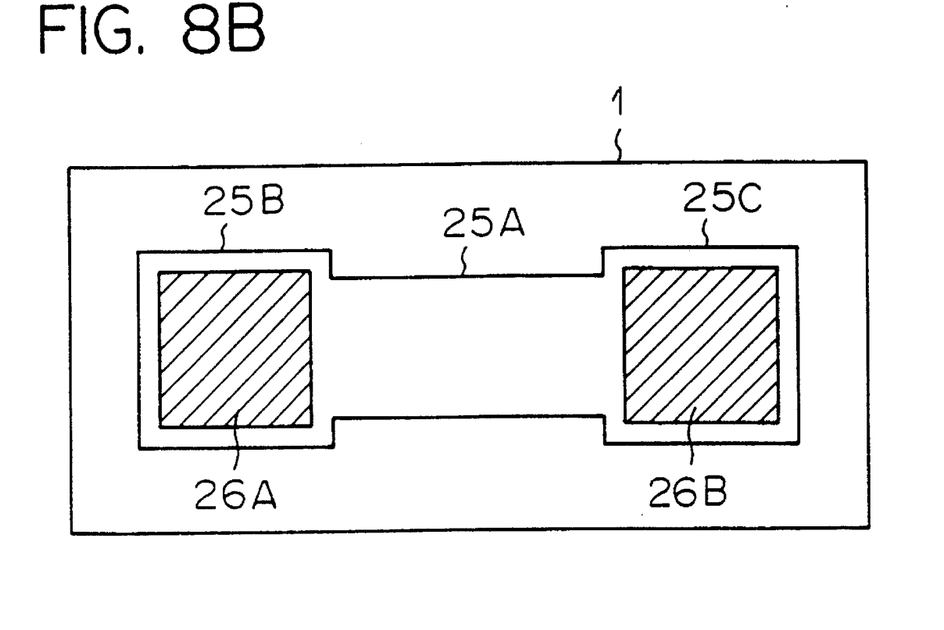
FIG. 8B is a plan view showing the electrodes 26A and 26B formed on the terminals of the pattern shown in FIG. 8A.

The surface of the a-Si layer of each of the samples #1 and #2 was subjected to XeF excimer laser-annealing, followed by forming thereon a pattern having a rectangular section 25A with a length D and a width W and two square terminal sections 25B and 25C adjoining the opposite ends of the rectangular section 25A, each of the square sections having a side longer than the width W of the rectangular section 25A, as shown in FIG. 8A. Then, Al electrodes 26A and 26B were formed on the terminal sections 25B and 25C, as shown in FIG. 8B. The current/voltage characteristics between the electrodes were measured to determine the resistance R. The resistivity ρ was calculated by the following equation:

$$\rho = R \cdot d \cdot W/D$$

where d is the film thickness of the Si layer which is 60 nm and W/D=100 μm/200 μm.

It is seen in FIG. 7 that the sample #1 exhibits a sharp decrease in resistivity whereas the sample #2 exhibits only a gentle decrease in resistivity. It is believed that the reason is that in the sample #1 P atoms are taken as impurities from the doped surface layer of SiO₂ into the Si layer melted by laser energy, which is then transformed to n⁺ poly-Si upon cooling down, whereas in the sample #2 the a-Si is melted by laser energy and gets only polycrystalized when it cools down.

In FIGS. 3A–3F and FIGS. 4A–4F, while the transparent insulation film 2 formed on the glass substrate 1 serves to reduce unevenness in the electrical characteristics of the TFT by smoothing out any flaws and/or irregularities that may be present on the surface of the substrate, it may be omitted for reduction in the cost of production.

While the self-alignment is described as being effected by the use of a laser beam in the foregoing description of the invention, infrared radiation as from an infrared lamp may be used in lieu of a laser beam.

While it is stated in the foregoing description that PH₃ plasma treatment is used to diffuse P atoms to produce an n type TFT, B₂H₆ plasma treatment may be equally used to diffuse B (boron) atoms to produce a p type TFT. In the latter case, the source and drain regions 5b and 5c will be p⁺ poly-Si.

As discussed hereinabove, according to this invention, P or B atoms are diffused into the surface layer by plasma treatment, and the a-Si layer formed on top of the doped layer is irradiated with a laser beam with the gate electrode 7 acting as a mask, whereby source and drain regions 5b and 5c of either n⁺ type or p⁺ type poly-Si may be formed adjacent to and on the opposite sides of the channel region 50 of a-Si having a width equal to that of the gate electrode. Consequently, since there are no portions of the gate electrode which overlap the source and drain regions 5b and 5c, the parasitic capacitances between the electrodes may be greatly reduced, and so may the ON-resistance between the source and drain be reduced, as is the case with the conventional TFT as shown in FIG. 2. In addition, as no SOG is used, it is possible to produce TFTs without heating the glass substrate to an elevated temperature of 400° C. or higher. Consequently, when this invention is applied to production of TFTs for large surface area LCDs, it is only required to employ substantially the same level of process temperature as in the prior art, so that the distortion and/or shrinkage of the glass substrate may be mitigated to a negligible level. Further, there is no crack problem which would occur when the SOG technique is used.

When TFTS produced by the method of this invention are employed as switching elements for TFTLCD, the image-holding phenomenon is reduced owning to reduced parasitic capacitances. Moreover, the precision limits on the registration between the source or drain lead and the gate electrode may be moderated because of the self-alignment realized by this invention.

We claim:

1. A top gate thin-film transistor having a glass substrate, source and drain electrodes supported on said glass substrate and having end edges in spaced and opposed relation to each other, a semiconductor layer extending between said source and drain electrodes, said semiconductor layer overlapping and being connected to spaced ends of said source and drain electrodes, a gate insulation film formed over said semiconductor layer, and a gate electrode formed on said gate insulation film between said source and drain electrodes in opposing relation with said semiconductor layer, said gate electrode having opposite side edges spaced apart predetermined distances from said source and drain electrodes; and a doped surface layer formed by diffusing impurity atoms in surfaces of said source and drain electrodes and in a surface extending between said spaced ends of said source and drain electrodes under and in contact with said semiconductor layer;

said semiconductor layer including a channel region of amorphous Si having the same width as that of said gate electrode and being masked by said gate electrode, and source and drain regions of poly-Si doped with said impurity atoms and extending outwardly from side edges of said channel region, respectively.

2. The top gate thin-film transistor of claim 1, wherein said doped surface layer is formed to extend over said source and drain electrodes, and said semiconductor layer is formed on said doped surface layer to extend between said source and drain electrodes with opposite end portions of said semiconductor layer straddling said source and drain electrodes, said gate electrode being made of metal to mask said channel region.

3. The top gate thin-film transistor of claim 1 further comprising;

a light shield formed on said glass substrate and having side edges in alignment with the side edges of said channel region to mask said channel region;

a transparent insulation film formed on said light shield to extend all over the face of said glass substrate;

said source and drain electrodes being formed on said transparent insulation film such that end edges of said source and drain electrodes are in opposed relation with and spaced by predetermined distances outwardly of the corresponding opposite side edges of said light shield;

said semiconductor layer being formed on said doped surface layer so as to span a space between said source and drain electrodes with opposite end portions of said semiconductor layer straddling said source and drain electrodes; and said gate electrode being formed of a transparent conductive film.

4. The top gate thin-film transistor of claim 1, wherein said doped surface layer is formed over the entire face of said glass substrate;

said semiconductor layer is formed on said doped surface layer;

said gate insulation film is formed on said semiconductor layer to extend all over the face of said glass substrate;

the opposite side edges of said gate electrode are recessed by predetermined distances inwardly of corresponding opposite end edges of said semiconductor layer;

said gate electrode is made of metal;

contact holes are formed through said gate insulation film adjacent the opposite side edges of said gate electrode to reach to said source and drain regions, respectively; and said source and drain electrodes are formed on said gate insulation film such that end portions of said source and drain electrodes fill the corresponding contact holes so as to contact said source and drain regions, respectively.

5. The top gate thin-film transistor of claim 1, further comprising:

a light shield having side edges in alignment with the side edges of said gate electrode and formed on said glass substrate;

a transparent insulation film formed on said light shield to extend all over the face of said glass substrate, said doped surface layer, being formed on said transparent insulation film over the entire face of said glass substrate;

said semiconductor layer being formed on said doped surface layer;

said gate insulation film being formed on said semiconductor layer to extend all over the face of said glass substrate;

said gate electrode being composed of a transparent conductive film formed on said gate insulation film by photolithography through exposure to light with said light shield acting as a mask;

contact holes formed through said gate insulation film adjacent the side edges of said gate electrode to reach said source and drain regions, respectively; and said source and drain electrodes being formed on said gate insulation film such that opposing end portions of said source and drain electrodes fill the corresponding contact holes so as to contact said source and drain regions, respectively.

6. The top gate thin-film transistor of claim 1, further comprising a transparent insulation film formed directly on said glass substrate over the entire face thereof.

7. The top gate thin-film transistor of claim 6, wherein said doped surface layer is formed by plasma treatment on a surface of said transparent insulation film which is in contact with said semiconductor layer.

8. The top gate thin-film transistor of claim 6, wherein said source and drain electrodes are formed on said transparent insulation film, and said doped surface layer is formed by plasma treatment over said source and drain electrodes and over said transparent insulation film between said source and drain electrodes.

9. The top gate thin-film transistor of claim 1 or 6, wherein said impurity atoms comprise P atoms and said source and drain regions comprise $n^+$ type poly-Si layers.

10. The top gate thin-film transistor of claim 1 or 6, wherein said impurity atoms comprise B atoms and said source and drain regions comprise $p^+$ type poly-Si layers.

11. The top gate thin-film transistor of claim 7 or 8, wherein a light shield is formed between said glass substrate and said transparent insulation film in opposing relation to said semiconductor layer, said light shield having side edges in alignment with the side edges of said gate electrode, thereby masking said channel region of a-Si.

12. The top gate thin-film transistor of claim 1, wherein said doped surface layer is formed on said source and drain electrodes to extend over the entire face of said glass substrate.

13. The top gate thin-film transistor of claim 1, wherein said doped surface layer is formed under said semiconductor layer to extend over the entire face of said glass substrate.

14. The top gate thin-film transistor of any one of claims 2 to 5 wherein, said impurity atoms comprise P atoms, and said source and drain regions comprise $n^+$ type poly-Si layers.

15. The top gate thin-film transistor of any one of claims 2 to 5 wherein, said impurity atoms comprise B atoms, and said source and drain regions comprise $p^+$ type poly-Si layers.

16. The top gate thin-film transistor of one of claim 2 or 5 wherein, said transparent insulation film comprises $SiO_2$.

17. The top gate thin-film transistor of one of claims 3 or 5 wherein, said transparent insulation film comprises $SiN_x$.

18. The top gate thin-film transistor of claim 1 or 2 wherein, said gate electrode is formed of metal composed of at least Al.

19. The top gate thin-film transistor of claim 1 or 2 wherein, said gate insulation film comprises $SiN_x$.

20. The top gate thin-film transistor of claim 1 or 2 wherein, said gate insulation film comprises $SiO_2$.

* * * * *